(12) United States Patent
Fukatsu et al.

(10) Patent No.: US 9,196,822 B2
(45) Date of Patent: Nov. 24, 2015

(54) MAGNETORESISTIVE EFFECT ELEMENT

(71) Applicant: Kabushiki Kaisha Toshiba, Tokyo (JP)

(72) Inventors: Shigeto Fukatsu, Kanagawa (JP);
Tatsuya Kishi, Kanagawa (JP);
Masahiko Nakayama, Yamaguchi (JP);
Akiyuki Murayama, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 13/777,643

(22) Filed: Feb. 26, 2013

(65) Prior Publication Data
US 2014/0070343 A1  Mar. 13, 2014

(30) Foreign Application Priority Data

Sep. 7, 2012 (JP) .................. 2012-197826

(51) Int. Cl.
H01L 29/82 (2006.01)
H01L 43/02 (2006.01)
H01L 43/12 (2006.01)
H01L 27/22 (2006.01)
H01L 43/08 (2006.01)

(52) U.S. Cl.
CPC .............. *H01L 43/02* (2013.01); *H01L 27/222* (2013.01); *H01L 27/228* (2013.01); *H01L 29/82* (2013.01); *H01L 43/08* (2013.01); *H01L 43/12* (2013.01)

(58) Field of Classification Search
CPC ...... H01L 27/222; H01L 29/82; H01L 27/228
USPC .................................. 257/421, 422
See application file for complete search history.

(56) References Cited

U.S. PATENT DOCUMENTS

| 2008/0291585 A1 | 11/2008 | Yoshikawa et al. |
| 2010/0080894 A1 | 4/2010 | Tsunekawa et al. |
| 2011/0062537 A1 | 3/2011 | Oh et al. |

FOREIGN PATENT DOCUMENTS

| JP | 2008-085170 | 4/2008 |
| JP | 2010027912 A | 2/2010 |
| WO | 2010026725 A1 | 3/2010 |

*Primary Examiner* — Howard Weiss
*Assistant Examiner* — Tifney Skyles
(74) *Attorney, Agent, or Firm* — Patterson & Sheridan, LLP

(57) ABSTRACT

A magnetoresistive effect element in one or more embodiments of the present invention is provided with a memory layer with a variable magnetization direction having a magnetic anisotropy in a direction perpendicular to a film surface, a reference layer with an invariable magnetization direction having the magnetic anisotropy in a direction perpendicular to the film surface, and a tunnel barrier layer formed between the memory layer and the reference layer. The tunnel barrier layer has a first portion at the central part in the film surface and a second portion at a peripheral part. The second portion contains at least boron and oxygen.

3 Claims, 6 Drawing Sheets

MAGNETORESISTIVE EFFECT ELEMENT

CROSS-REFERENCE TO RELATED APPLICATION

This application is based upon and claims the benefit of priority from Japanese Patent Application No. 2012-197826, filed Sep. 7, 2012; the entire contents of which are incorporated herein by reference.

FIELD

Embodiments described herein relate generally to a magnetoresistive effect element.

BACKGROUND

Spin injection-type Magnetic Random Access Memory (MRAM) provided with a magnetoresistive effect element (magnetoresistive element) having a ferromagnetic body as a memory element have been proposed. This MRAM, which operates by changing the magnetization direction of the magnetic layer using electric current injected into the magnetoresistive effect element, memorizes information by maintaining the electric resistance of the magnetoresistive effect element in one of two high resistance state/low resistance states.

In the spin injection-type MRAM, to reverse the magnetization direction of the magnetic layer, a sufficiently large inversion current, including a margin, flows to the magnetoresistive effect element. During switching of the magnetic state, an electric stress is imposed on the tunnel barrier layer which it is likely to cause dielectric breakdown. Furthermore, due to etching or other processing damages, a defect may be present in the peripheral part (the terminal part) of the tunnel barrier layer. Therefore, especially in the peripheral part of the tunnel barrier layer, the problem of dielectric breakdown or shorting due to the electric stress may occur.

DETAILED DESCRIPTION

Figure 1:
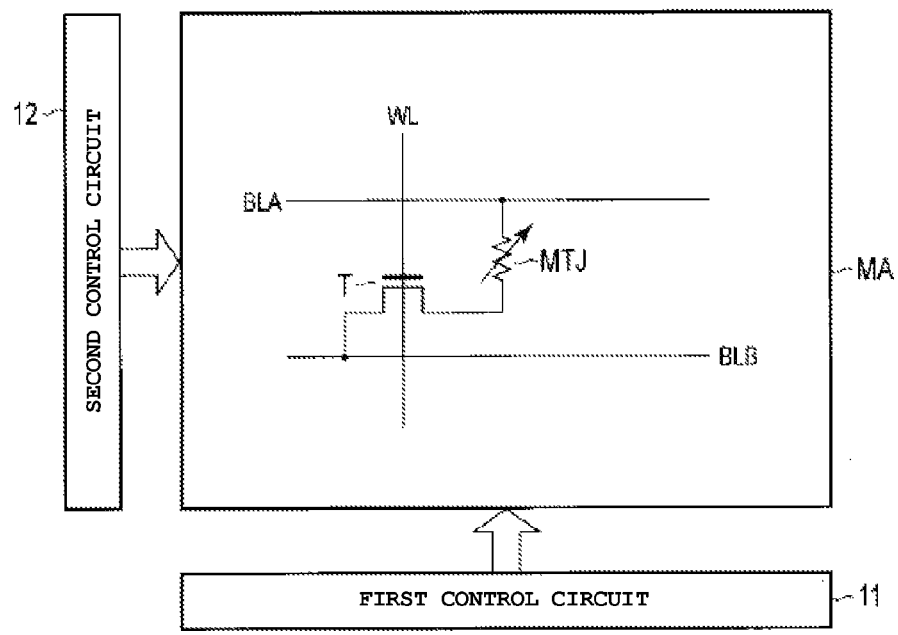
FIG. 1 is a circuit diagram showing an example of a memory cell of an MRAM.

A magnetoresistive effect element with improved reliability is provided by one or more of the embodiments of the present invention.

A description of an embodiment is described herein, with reference to the drawings. In the drawings, the same reference symbols will be given to the same portions. Furthermore, duplicate explanation will be carried out as necessary.

A magnetoresistive effect element is provided with a memory layer with a variable magnetization direction having a magnetic anisotropy in a direction perpendicular to a film surface, a reference layer with an invariable magnetization direction having the magnetic anisotropy in a direction perpendicular to the film surface, and a tunnel barrier layer formed between the memory layer and the reference layer. The tunnel barrier layer has a first portion at the central portion thereof and a second portion at a peripheral portion thereof. The second portion contains at least B (boron) and O (oxygen) as the main components thereof.

(MRAM Configuration Example)

By using FIG. 1 and FIG. 2, an explanation will be given with regard to a configuration example of the MRAM.

FIG. 1 is a circuit diagram showing an example of the architecture of a memory cell of an MRAM.

As shown in FIG. 1, a memory cell inside a memory cell array MA is provided with a series connection body of a magnetoresistive effect element MTJ and a switch element T (for example, a FET). The one end of the series connection body (one end of the magnetoresistive effect element MTJ) is connected to a bit line BLA, and the other end of the series connection body (one end of the switch element T) is connected to a bit line BLB. The control terminal of the switch element T, for example, the gate electrode of a FET, is connected to the word line WL.

The electric potential of a word line WL is controlled by a first control circuit 11. Furthermore, electric potentials of the bit line BLA and the bit line BLB are controlled by a second control circuit 12.

Figure 2:
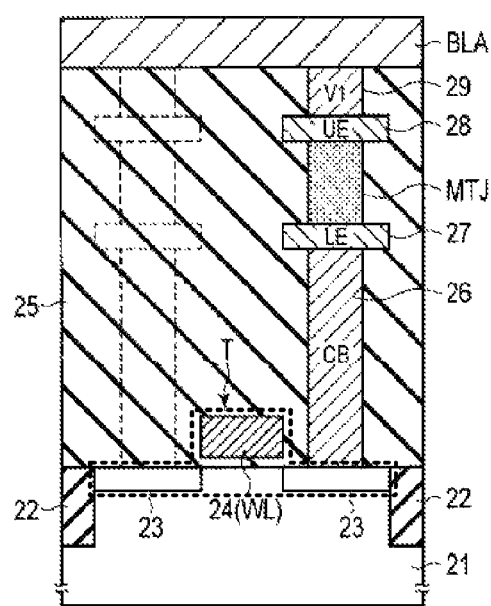
FIG. 2 is a cross-sectional diagram showing an example of a structure of the memory cell of the MRAM.

FIG. 2 is a cross-sectional diagram showing an example of the configuration of the memory cell of the MRAM.

As shown in FIG. 2, the memory cell is configured by the switch element T and the magnetoresistive effect element MTJ formed on a semiconductor substrate 21.

The semiconductor substrate 21 is, for example, a silicon substrate. Its electric conduction type can be any of a P type or an N type. Inside the semiconductor substrate 21, as an element isolation insulation layer 22, for example, $SiO_2$ (silicon oxide) layer of a STI structure is formed.

The switch element T is formed on the semiconductor substrate 21, specifically, in an element region (active area) surrounded by the element isolation insulation layer 22. In this example, the switch element T is an FET, and has two source/drain diffusion layers 23 inside the semiconductor substrate 21 and a gate electrode 24 formed on top of the channel region between them. The gate electrode 24 functions as a word line WL.

The gate electrode 24 is covered with an interlayer insulation layer 25 (for example, $SiO_2$). The contact hole is provided within the interlayer insulation layer 25. A contact via (CB) 26 is formed inside the contact hole. The contact via 26 is comprised of, for example, W, Cu, or other metal materials.

The bottom of the contact via 26 is connected to the switch element. In this example, the contact via 26 is connected directly to the source/drain diffusion layer 23.

On top of the contact via 26, a lower electrode (LE) 27 is formed. The lower electrode 27 has a stacked structure of, for example, Ta (10 nm)/Ru (5 nm)/Ta (5 nm).

On top of the lower electrode 27, that is, directly on top of the contact via 26, the magnetoresistive effect element MTJ is formed. In this embodiment, the details with regard to the magnetoresistive effect element MTJ will be described later.

On top of the magnetoresistive effect element MTJ, an upper electrode (UE) 28 is formed. The upper electrode 28 includes, for example, TiN. The upper electrode 28, via a via 29 (for example, Cu), is connected to a bit line BLA (for example, a Cu line).

Embodiment

Referring FIG. 3 to FIG. 10, an explanation will be given with regard to the magnetoresistive effect element MTJ according to this embodiment.

In this embodiment, the tunnel barrier layer 32 has a first portion 35 at a central part and a second portion 36 at a peripheral part thereof. The second portion 36 contains B and O as main components. These components enable the tunnel barrier layer 32 to withstand a high voltage, and reliability of the magnetoresistive effect element MTJ can be improved. In the following, a detailed explanation will be given with regard to the magnetoresistive effect element MTJ according to this embodiment.

(Configuration)

By using FIG. 3 to FIG. 8, an explanation will be given with regard to the configuration of the magnetoresistive effect element MTJ according to this embodiment.

Figure 3:
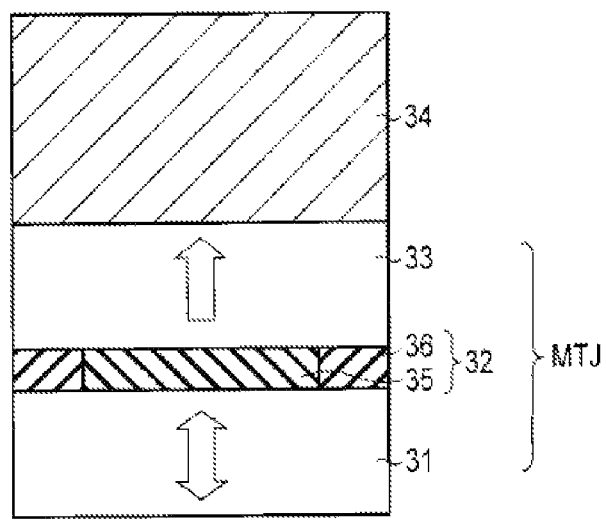
FIG. 3 is a cross-sectional diagram showing a structure of a magnetoresistive effect element according to an embodiment.

FIG. 3 is a cross-sectional diagram showing a configuration of the magnetoresistive effect element MTJ according to the present embodiment.

As shown in FIG. 3, the magnetoresistive effect element MTJ is provided with the memory layer 31, the tunnel barrier layer 32, the reference layer 33, and so on.

The memory layer 31 is formed via the underlying layer, not shown in the drawing, on the lower electrode 27. The memory layer 31 is a ferromagnetic layer with a variable magnetization direction, and has a vertical magnetic anisotropy that is vertical or virtually vertical to the film surface (top plane/bottom plane). The memory layer 31 has a vertical magnetic anisotropy that is vertical or virtually vertical to the film surface at the interface with the tunnel barrier layer 32, which is to be described later. Here, the fact that the magnetization direction is variable means that the magnetization direction is variable with respect to a given write current. Furthermore, the fact that the magnetization direction is vertical or virtually vertical means that the direction of the residual magnetization is within the range of $45°<\theta\leq90°$ with respect to the film surface.

Furthermore, the memory layer 31 is comprised of by, for example, the ferromagnetic body containing Co and Fe. Furthermore, for the purpose of adjusting saturation magnetization and crystal magnetic anisotropy, and so on, B is added to the ferromagnetic body. In other words, the memory layer 31 includes, for example, CoFeB or other B compounds. The B concentration in the memory layer 31 is less than 30 atomic % or so. C, Si, or other elements may be added into the ferromagnetic body.

The tunnel barrier layer 32 is formed on top of the memory layer 31. The tunnel barrier layer 32 is a nonmagnetic layer. The details with regard to the tunnel barrier layer 32 in this embodiment will be described later.

The reference layer 33 is formed on top of the tunnel barrier layer 32. The reference layer 33 is a ferromagnetic layer with an invariable magnetization direction and has a vertical magnetic anisotropy vertical or virtually vertical to the film surface. Here, the fact that the magnetization direction is invariable means that the magnetization direction is invariable with respect to a given write current. In other words, reverse energy barrier of the reference layer 33 is larger in the magnetization direction than reverse energy barrier of the memory layer 31.

Furthermore, the reference layer 33 is comprised of, for example, the ferromagnetic body containing at least one of the elements of Co, Fe, B, Ni, Ir, Pt, Mn, Pd, Tb, Gd, Nd, Sm, and Cr. Furthermore, for the purpose of adjusting the saturation magnetization and crystal magnetic anisotropy, and so on, B is added to the ferromagnetic body. In other words, the reference layer 33 includes, for example, CoFeB or other B compounds. The B concentration in the reference layer 33 is less than 20 atomic % or so. It is also acceptable that C, Si, or other elements are added into the ferromagnetic body.

At least a layer that contacts with the tunnel barrier layer 32 (i.e., at least the memory layer 31 or the reference layer 33) contains B. The concentration of B in the layer is preferably about 30 atomic % or less.

On the reference layer 33, a hard mask layer 34 is formed. The hard mask layer 34 includes a metal material having an electrical conductivity, for example, TiN. Furthermore, the hard mask layer 34 can be comprised of a film containing any of Ti, Ta, or W, or a laminated film thereof.

The upper electrode 28 (FIG. 1) is formed on top of the hard mask layer 34. The upper electrode 28 is in contact with the hard mask layer 34 including a metal material, so that the upper electrode 28, via the hard mask layer 34, is electrically connected with the magnetoresistive effect element MTJ.

The planar shapes of the memory layer 31, the tunnel barrier layer 32, the reference layer 33, and the hard mask layer 34 are, for example, circular. Therefore, the magnetoresistive effect element MTJ is formed in a pillar shape.

The tunnel barrier layer 32 in this embodiment has the first portion 35 and the second portion 36.

Figure 4:
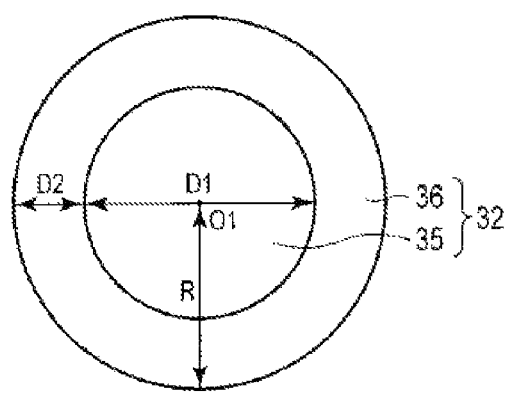
FIG. 4 is a planar diagram showing a structure of a tunnel barrier layer according to an embodiment.
Figure 5:
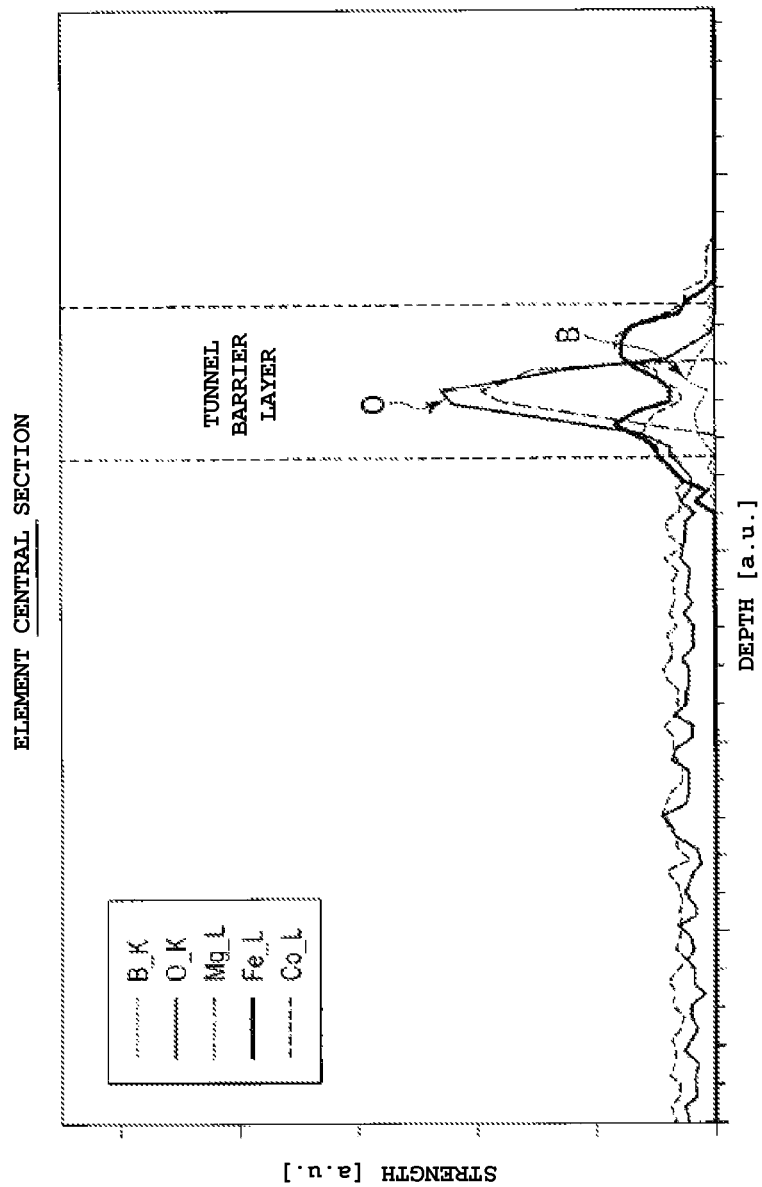
FIG. 5 is a diagram showing the Electron Energy Loss Spectroscopy (EELS) analytical results of the central part in the tunnel barrier layer according to an embodiment.
Figure 6:
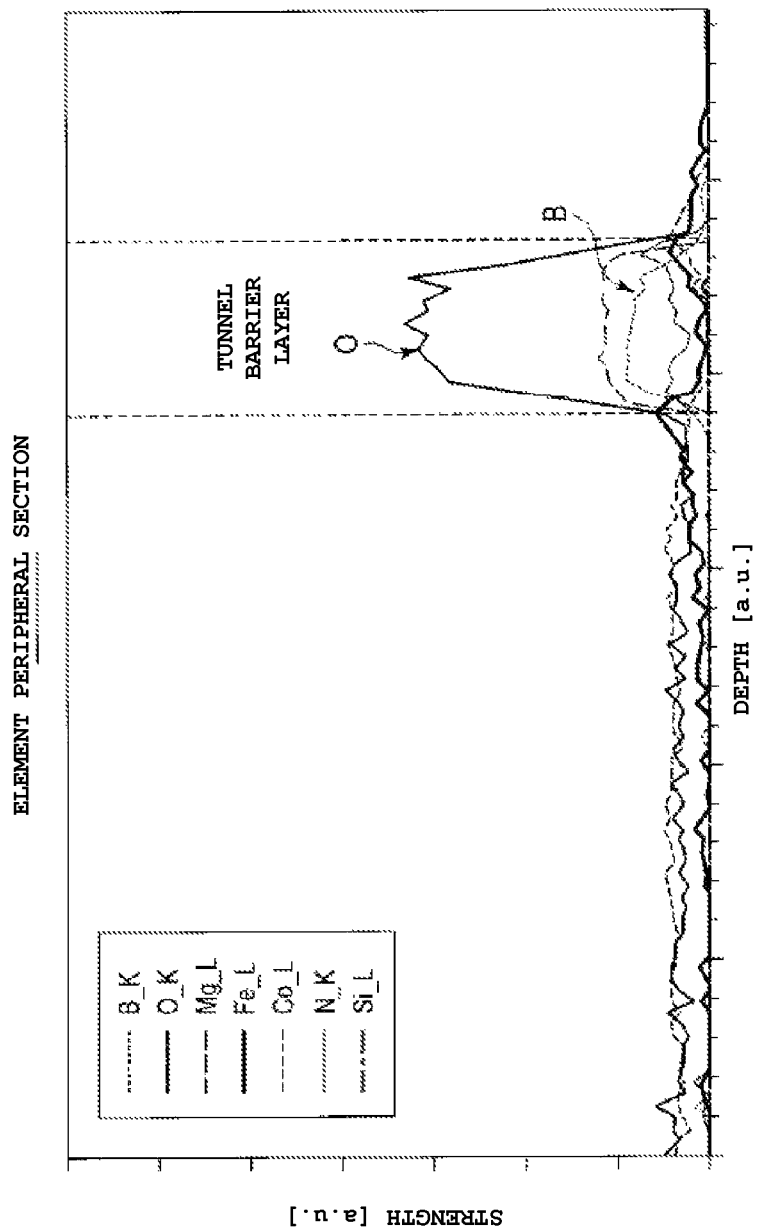
FIG. 6 is a diagram showing the EELS analytical results of the peripheral part in the tunnel barrier layer according to an embodiment.

FIG. 4 is a planar diagram showing a configuration of the tunnel barrier layer 32 according to this embodiment. FIG. 5 is a diagram showing the EELS analytical results of the central part (the first portion 35) in the tunnel barrier layer 32 according to this embodiment. FIG. 6 is a diagram showing the EELS analytical results of the peripheral part (the second portion 36) in the tunnel barrier layer 32 according to this embodiment.

As shown in FIG. 3 and FIG. 4, the first portion 35 is formed at the center part of the tunnel barrier layer 32 on the flat surface (the film surface), and the second portion 36 is formed at the peripheral part of the tunnel barrier layer 32 on the flat surface, in other words, portion 36 surrounds portion 35. In this manner, the first portion 35 is formed in a cylinder shape, and the second portion 36 is formed in a circular cylindrical tubular shape so that the first portion 35 is contained inside the second portion 36.

As shown in FIG. 5, the first portion 35 contains at least Mg and O (for example, Mg oxide) as the main components. With this first portion 35, the vertical magnetic anisotropy is generated at the interface with the first portion 35 in the memory layer 31.

In contrast to this, as shown in FIG. 6, the second portion 36 contains at least B and O (for example, B oxide) as the main components. In other words, the concentration of B in the second portion 36 is higher than the concentration of B in the first portion 35. The B concentration in the second portion 36 is less than about 20 atomic %. This is because the concentration of B of the memory layer 31 and the reference layer 33, which are in contact with the second portion 36, are less than about 30 atomic % and because B of the second portion 36 is formed by the diffusion of B from the memory layer 31 and the reference layer 33 into the second portion 36. Furthermore, the second portion 36 may contain Mg.

For example, as shown in FIG. 4, the flat surface shape of the magnetoresistive effect element MTJ (the tunnel barrier layer 32) is circular and its diameter is 50 nm or so, a width (the diameter) D1 on the flat surface of the first portion 35 is about 26 nm, and a width D2 on the flat surface of the second portion 36 is about 12 nm. In this case, the first portion is formed in a region from the center O1 of the magnetoresistive effect element MTJ (the tunnel barrier layer 32) to the inside of about ½ of its radius R, and the second portion 36 is formed in a region from the center O1 of the magnetoresistive effect element MTJ to the outside of about ½ of its radius R.

The width of the second portion is not restricted to this. The width D2 of the second portion 36 on the flat surface can also be more than 0.7 nm and less than 12 nm or so. The reason for the preferable range of the width D2 of the second portion 36 on the flat surface will be explained by the following.

Figure 7:
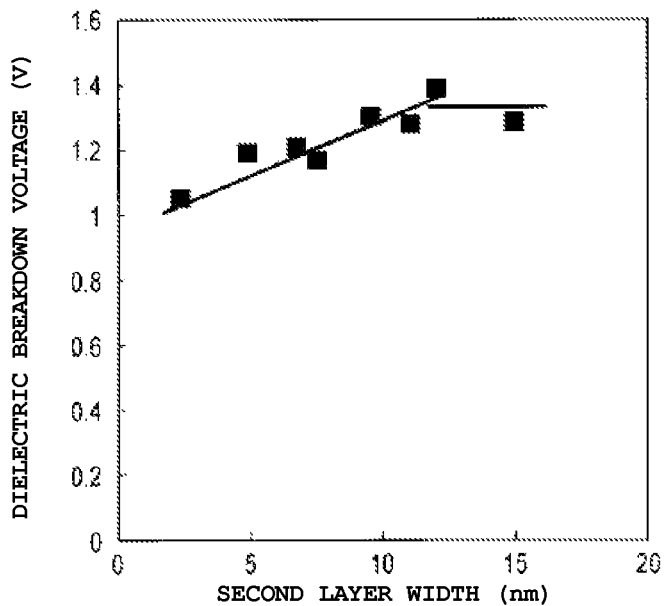
FIG. 7 is a graph showing the relationship between a width of a second portion and a dielectric breakdown voltage of the tunnel barrier layer.

FIG. 7 is a graph showing the relationship between the width D2 of the second portion 36 and the dielectric breakdown voltage of the tunnel barrier layer 32.

As shown in FIG. 7, as the width D2 of the second portion 36 increases, the dielectric breakdown voltage of the tunnel barrier layer 32 increases. In other words, by increasing the width D2 of the second portion 36, the tunnel barrier layer 32 can withstand a higher voltage and the reliability of the magnetoresistive effect element MTJ improves.

However, if the width D2 of the second portion 36 is increased to more than 12 nm, the effect on the dielectric breakdown voltage of the tunnel barrier layer 32 does not change from that at 12 nm in width. This is considered to result from the processing damage that causes defects in the tunnel barrier layer 32 in the area from the peripheral surface to about 12 nm into the tunnel barrier layer 32. Thus, by having the width D2 of the second portion 36 at about 12 nm, the effect of these defects on performance can be ameliorated.

Furthermore, if the width D2 of the second portion 36 is too large, the content of the first portion 35 inside the tunnel barrier layer 32 decreases. Therefore, the vertical magnetic anisotropy of the memory layer 31 formed at the interface with the first portion 35 will decrease. Owing to this, the function as the magnetoresistive effect element MTJ will be deteriorated and so will be its reliability.

Thus, by taking into consideration the dielectric breakdown voltage (high pressure resistance) of the tunnel barrier layer 32 and the function as the magnetoresistive effect element MTJ, it is desirable to set the width D2 of the second portion 36 at or less than 12 nm as the upper limit.

Figure 8:
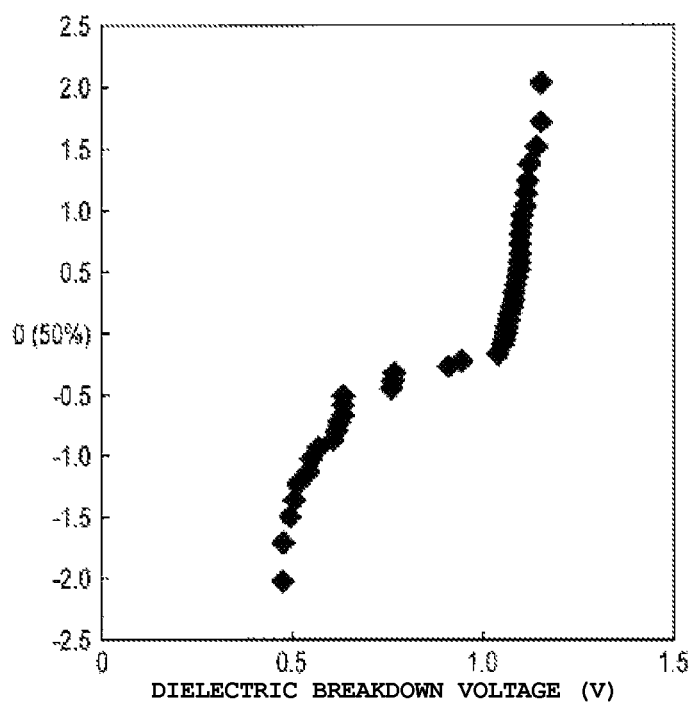
FIG. 8 is a graph showing a cumulative distribution function of a standard regular distribution of a dielectric breakdown voltage of the tunnel barrier layer.

FIG. 8 is a graph showing a cumulative distribution function of a standard regular distribution of the dielectric breakdown voltage of the tunnel barrier layer 32.

Here, the dielectric breakdown voltage when the width D2 of the second portion 36 is 0.7 nm is shown.

As shown in FIG. 8, when the width D2 of the second portion 36 is 0.7 nm, the distribution of the breakdown resistance of the tunnel barrier layer 32 significantly low. More specifically, even at a low voltage of 0.6-1.0 V or so in nearly one-half of the cases, dielectric breakdown will occur. In other words, if the width D2 of the second portion 36 is less than 0.7 nm, the tunnel barrier layer 32 cannot withstand higher voltage and its reliability will decrease. This is believed to be due to the fact that, if the width D2 of the second portion 36 is less than 0.7 nm, the defects on the peripheral part side of the tunnel barrier layer 32 cannot be ameliorated.

In this manner, by taking into consideration the dielectric breakdown voltage of the tunnel barrier layer 32, it is desirable to set the width D2 of the second portion 36 at more than 0.7 nm as the lower limit.

Based on the above, in order to improve the reliability of the magnetoresistive effect element MTJ, it is desirable to set the width D2 of the second portion 36 at more than 0.7 nm and less than 12 nm. If there is no problem in the voltage resistance of the tunnel barrier layer 32, with the consideration of the deterioration in the function as the magnetoresistive effect element MTJ, it is desirable to set the width D2 of the second portion 36 at less than 5.0 nm to increase the area of first portion 35.

It is also acceptable to form an interface layer between the reference layer 33 and the tunnel barrier layer 32, although not shown in the drawing. The interface layer is formed to achieve the lattice matching characteristic with the tunnel barrier layer 32 in contact with the bottom of the reference layer 33. The interface layer can be composed of the same materials as that of the reference layer 33, for example. However, its compositional ratio can also be different.

Furthermore, on top of the reference layer 33, via a spacer layer (for example, Ru or the like), which is not shown in the drawing, a shift adjustment layer may also be formed. The shift adjustment layer is a magnetic layer with an invariable magnetization direction and has a vertical magnetic anisotropy vertical or virtually vertical to the film surface. Furthermore, its magnetization direction is opposite to the magnetization direction of the reference layer 33. Because of the magnetization direction of the shift adjustment layer, the shift adjustment layer can cancel the leaking magnetic field from the reference layer 33 imposed on the memory layer 31. In other words, the shift adjustment layer has an effect of adjusting the magnetization direction of the leaking magnetic field from the reference layer 33 to the opposite direction. This shift adjustment layer can be comprised of the artificial lattice including the laminated structure of, for example, Ni, Fe, Co or other magnetic materials and Cu, Pd, Pt, or other nonmagnetic materials, or the like.

Furthermore, the memory layer 31 and the reference layer 33 may have a dimensional difference on the flat surface. For example, the diameter of the memory layer 31 on the flat surface can be smaller than the diameter of the reference layer 33. This dimensional difference can prevent electrical shorts between the memory layer 31 and the reference layer 33. The planar shape of the magnetoresistive effect element MTJ (and thus tunnel barrier layer 32) is not restricted to a circular shape. It can also be a square, rectangular, elliptical, or another shapes.

Furthermore, the disposition of the memory layer 31 and the reference layer 33 may be reversed. In other words, on top of the lower electrode 27, the reference layer 33, the tunnel barrier layer 32, and the memory layer 31, in the sequence, can be formed as well.

Operation Example

Next, an operational example of the magnetoresistive effect element MTJ will be explained.

The magnetoresistive effect element MTJ is, for example, a spin injection-type magnetoresistive effect element. Thus, in the case of writing the data in the magnetoresistive effect element MTJ or reading out of the data from the magnetoresistive effect element MTJ, in a direction perpendicular to the film surface, the electric current flows in both directions.

Specifically, the write of the data in the magnetoresistive effect element MTJ is carried out in the following manner in reference to FIG. 2 and FIG. 3.

In the case of supplying electrons from the upper electrode 28 side (i.e., supplying electrons toward the memory layer 31 from the reference layer 33), the spin polarized electrons are injected into the memory layer 31 in the same direction as the magnetization direction of the reference layer 33. In this case, the magnetization of the memory layer 31 is aligned in the same direction as the magnetization direction of the reference layer 33. Thus, the magnetization of the reference layer 33 and the magnetization of the memory layer 31 are arranged in parallel. At the time of this parallel arrangement, the resistance value of the magnetoresistive effect element MTJ is the smallest. This case is specified as, for example, data "0".

On the other hand, in the case of supplying electrons from the lower electrode 27 side (i.e., supplying electrons toward the reference layer 33 from the memory layer 31), the spin polarized electrons are injected into the memory layer 31 in the direction opposite to the magnetization direction of the reference layer 33 by reflection due to the reference layer 33. In this case, the magnetization direction of the memory layer 31 is aligned in the opposite direction of the magnetization of the reference layer 33. Thus, the magnetization of the reference layer 33 and the magnetization of the memory layer 31 are in anti-parallel arrangement. At the time of this anti-parallel arrangement, the resistance value of the magnetoresistive effect element MTJ is the largest. This case is specified as, for example, data "1".

Furthermore, the read out of the data is carried out in the following manner.

In the magnetoresistive effect element MTJ, the read current is supplied. This read current is set at a value (a value smaller than the write current) so that the magnetization direction of the memory layer 31 is not reversed. By detecting the change in the resistance value of the magnetoresistive effect element MTJ at this time, a semiconductor device is capable of memory operation.

(Manufacturing Method)

Next, by using FIG. 9 and FIG. 10, a method for the manufacture of the magnetoresistive effect element MTJ according to this embodiment will be explained.

Figure 9:
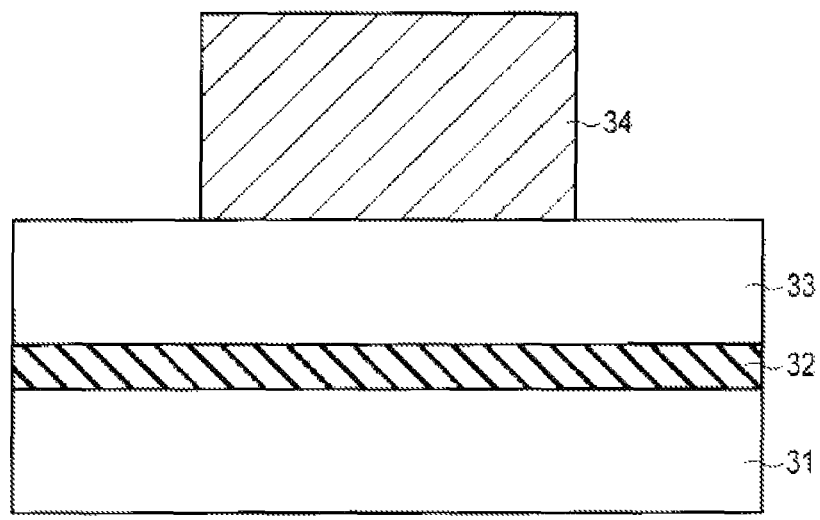
FIG. 9 is a cross-sectional diagram showing a process for manufacture of the magnetoresistive effect element MTJ according to an embodiment.
Figure 10:
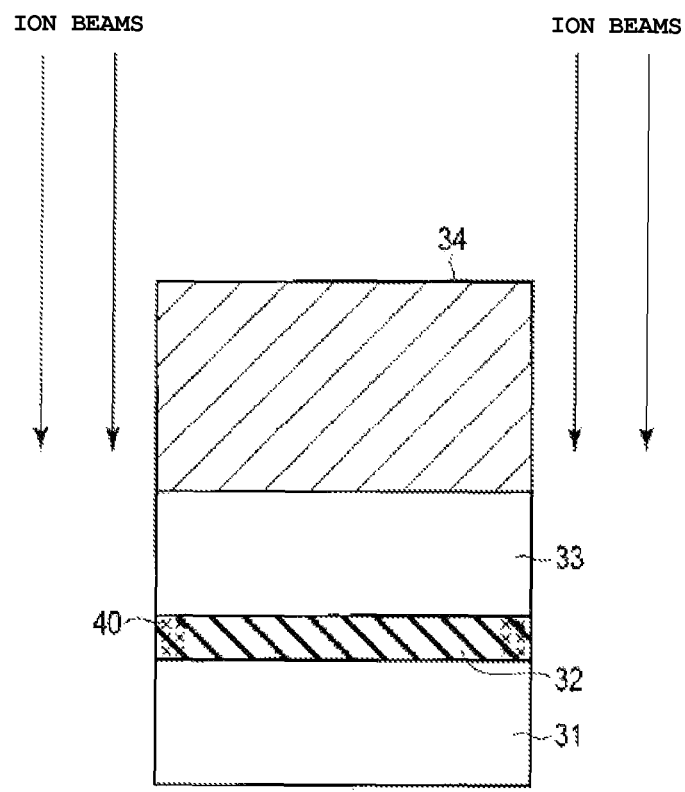
FIG. 10 is a cross-sectional diagram showing a process for the manufacture of the magnetoresistive effect element MTJ according to an embodiment, in continuation to FIG. 9.

FIG. 9 and FIG. 10 are the cross-sectional diagrams showing the manufacturing method of the magnetoresistive effect element MTJ according to this embodiment.

First of all, as shown in FIG. 9, for example, by a sputtering method, on the lower electrode 27, the memory layer 31 is formed via an underlying layer, which is not shown in the drawing. The memory layer 31 includes, for example, the ferromagnetic body containing Co and Fe. Furthermore, to adjust the saturation magnetization and crystal magnetic anisotropy, and so on, B is added to the ferromagnetic body. In other words, the memory layer 31 includes, for example, CoFeB or other B compounds. The concentration of B in the memory layer 31 is or less than 30 atomic %. C, Si, or other elements may be added into the ferromagnetic body.

Next, the tunnel barrier layer 32 is formed on the memory layer 31. The tunnel barrier layer 32 is a nonmagnetic layer and contains at least Mg and O (for example, Mg oxide) as the main components. The tunnel barrier layer 32, for example, after the formation of the Mg layer by a sputtering method, can be formed by oxidizing the Mg layer.

Next, for example, by a sputtering method, the reference layer 33 is formed on the tunnel barrier layer 32. The reference layer 33 includes the ferromagnetic body containing one or more elements of, for example, Co, Fe, B, Ni, Ir, Pt or Mn. To adjust the saturation magnetization and crystal magnetic anisotropy, and so on, B is added to the ferromagnetic body. In other words, the reference layer 33 includes, for example, CoFeB or other B compounds. The concentration of B in the reference layer 33 is or less than 30 atomic %. C, Si, or other elements may be added into the ferromagnetic body.

Next, the hard mask layer 34 is formed on the reference layer 33, for example, by a CVD method. The hard mask layer 34 includes a metal material having an electrical conductivity, for example, including TiN. Furthermore, the hard mask layer 34 may include a film containing any of Ti, Ta, or W, or a laminated film thereof.

Then, the hard mask layer 34 is patterned by lithography and RIE. By this patterning, the planar shape of the hard mask layer 34 is, for example, formed in a circular shape, and its diameter is, for example, formed at more than 40 nm and less than 60 nm. Therefore, the hard mask layer 34 is formed in a cylinder shape.

Next, as shown in FIG. 10, using the hard mask layer 34 as a mask, the reference layer 33, the tunnel barrier layer 32, and the memory layer 31, under the hard mask layer 34, are patterned by Etching (IBE) or other physical etching. In this process, the reference layer 33, the tunnel barrier layer 32, and the memory layer 31 are patterned in the same planar shape as the hard mask layer 34. Where the shape of the hard mask is circular, the flat surface shapes of the patterned layers are a circular shape. The diameters of the reference layer 33, the tunnel barrier layer 32, and the memory layer 31 are more than 40 nm and less than 60 nm.

At this time, the ion beams in the IBE are incident from the inclined direction (the oblique direction) with respect to the vertical direction of the film surface. In doing so, even if the metal material contained in the etched reference layer 33, the tunnel barrier layer 32, and the memory layer 31 is adhered on the side of the reference layer 33, the tunnel barrier layer 32, and the memory layer 31 as the re-deposited material, the etching can be carried out while removing the re-deposited material. The oblique direction means the direction inclined by $\theta$ ($0°<\theta<90°$) with respect to the vertical direction of the film surface. For example, $\theta$ is 45°.

Furthermore, as the IBE is used for the patterning process, a defect 40 is formed as a processing damage in the peripheral part of the tunnel barrier layer 32. This defect 40 is formed in the area from the peripheral surface to about 12 nm into the perimeter of the tunnel barrier layer 32.

The processing of the reference layer 33, the tunnel barrier layer 32, and the memory layer 31 is not restricted to the IBE. It can also be carried out with the Reactive Ion Etching (RIE). Even if the processing is carried out with the RIE, the defect 40 is formed in the peripheral part of the tunnel barrier layer 32.

Next, as shown in FIG. 3, a heat treatment is carried out to the reference layer 33, the tunnel barrier layer 32, and the memory layer 31.

Specifically, the heat treatment is carried out, for example, by using a non-oxidizing atmosphere or an oxidizing atmosphere at a temperature of more than 200° C. and less than 450° C. In the case of the heat treatment with a non-oxidizing atmosphere, B in the memory layer 31 and the reference layer 33, which are in contact with the tunnel barrier layer 32, diffuses to the peripheral part of the tunnel barrier layer 32 and, at the same time, is oxidized by O in the tunnel barrier layer 32. Furthermore, in the case of the heat treatment with an oxidizing atmosphere, B in the memory layer 31 and the reference layer 33, which are in contact with the tunnel barrier layer 32, diffuses to the peripheral part of the tunnel barrier layer 32 and, at the same time, is oxidized by the oxidizing atmosphere.

As a result, as the tunnel barrier layer 32, the first portion 35 at the central part containing at least Mg and O as the main components and the second portion 36 at the peripheral part containing at least B and O as the main components are formed. At this time, since the concentrations of B of the memory layer 31 and the reference layer 33, which are in contact with the second portion 36, are or less than 30 atomic %, the concentration of B of the second portion 36 is or less than 30 atomic %.

Furthermore, in order to improve the reliability of the magnetoresistive effect element MTJ, it is desirable that the width D2 of the second portion 36 is set at more than 0.7 nm and less than 12 nm. If there is no problem in the voltage resistance of the tunnel barrier layer 32, it is desirable that the width D2 of the second portion 36 is set at less than 5.0 nm because the existence of the tunnel barrier layer 32 decreases the function as a magnetoresistive effect element MTJ. The width D2 of the second portion 36 can be set appropriately, by controlling the diffusion of B by adjusting the temperature and the time of the heat treatment.

In doing so, the effect of the etch defect region 40 can be ameliorated by the formation of the second portion 36 as the peripheral part of the tunnel barrier layer 32.

The temperature of the heat treatment is not restricted to the range mentioned above. The lower limit may be determined so that B in the memory layer 31 and the reference layer 33, which are in contact with the tunnel barrier layer 32, diffuses to the peripheral part of the tunnel barrier layer 32. Also, the upper limit may be determined so that the function of the magnetoresistive effect element MTJ will not be deteriorated.

Afterwards, for example, by the CVD method, the interlayer insulation layer 25 including, for example, $SiO_2$, is formed about the MTJ. Then, after the flattening of the interlayer insulation layer 25 formed on the hard mask layer 34, the interlayer insulation layer 25 is etched. With this process, the top of the hard mask layer 34 is exposed. On top of this exposed hard mask layer 34, the upper electrode 28 including, for example, TiN is formed and is electrically connected to the magnetoresistive effect element MTJ.

Through the above-described processes, the magnetoresistive effect element MTJ in this embodiment is formed.

(Effects)

According to one or more of the embodiments of the described invention, the tunnel barrier layer 32 has the first portion 35 at the central part and the second portion 36 at the peripheral part, and the second portion 36 contains at least B and O as the main components. By forming the second portion 36, the defect 40 due to the processing damage of the peripheral part of the tunnel barrier layer 32 can be ameliorated or passivated to not have a deleterious effect. In other words, the tunnel barrier layer 32 can be made to have a higher voltage resistance, and the dielectric breakdown or shorting of the tunnel barrier layer 32 can be suppressed. As a result, reliability of the magnetoresistive effect element MTJ is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A tunnel junction layer for a magnetoresistive memory element formed between a reference layer and a memory layer of the magnetoresistive memory element, wherein a portion of the tunnel junction layer is doped greater than a remainder of the tunnel junction layer, and the portion of the tunnel junction layer having greater dopant concentration is large enough to increase a breakdown voltage of the tunnel junction layer without impairing a function of the memory layer, wherein the dopant is boron, and is introduced by diffusion of boron from an adjacent film layer into the tunnel junction layer.

2. The tunnel junction layer of claim 1, wherein the boron diffuses preferentially into a perimeter portion of the tunnel junction layer.

3. The tunnel junction layer of claim 1, wherein the portion of the tunnel junction layer having greater dopant concentration comprises oxygen.

* * * * *